US008330637B2

(12) United States Patent
Lee et al.

(10) Patent No.: US 8,330,637 B2
(45) Date of Patent: Dec. 11, 2012

(54) TIME-TO-DIGITAL CONVERTER AND OPERATION METHOD THEREOF

(75) Inventors: Jae-Sup Lee, Suwon-si (KR); Kang-Yoon Lee, Seoul (KR); An-Soo Park, Seoul (KR); Young-Gun Pu, Seoul (KR); Joon-Sung Park, Seoul (KR)

(73) Assignees: Samsung Electronics Co., Ltd., Suwon-si (KR); Konkuk University Industry Cooperation Corp., Seoul (KR)

( * ) Notice: Subject to any disclaimer, the term of this patent is extended or adjusted under 35 U.S.C. 154(b) by 100 days.

(21) Appl. No.: 13/089,558

(22) Filed: Apr. 19, 2011

(65) Prior Publication Data

US 2011/0260902 A1 Oct. 27, 2011

(30) Foreign Application Priority Data

Apr. 23, 2010 (KR) ........................ 10-2010-0038067

(51) Int. Cl.
*H03M 1/50* (2006.01)

(52) U.S. Cl. ........ 341/166; 327/158; 327/244; 327/149; 331/1 A; 331/1 R

(58) Field of Classification Search .......... 341/140–170; 327/158, 149, 244; 331/1 R, 1 A
See application file for complete search history.

(56) References Cited

U.S. PATENT DOCUMENTS

| | | | | |
|---|---|---|---|---|
| 7,928,888 | B1 * | 4/2011 | Chiu et al. | 341/161 |
| 7,932,847 | B1 * | 4/2011 | Hsieh et al. | 341/155 |
| 7,973,578 | B2 * | 7/2011 | Oh et al. | 327/158 |
| 7,978,111 | B2 * | 7/2011 | Sun et al. | 341/155 |
| 8,219,343 | B2 * | 7/2012 | Lin | 702/89 |
| 2009/0153377 | A1 * | 6/2009 | Chang | 341/53 |

* cited by examiner

*Primary Examiner* — Lam T Mai
(74) *Attorney, Agent, or Firm* — Jefferson IP Law, LLP

(57) ABSTRACT

A Time-to-Digital Converter (TDC) is provided. The TDC includes a first TDC unit for receiving a first input signal and a second input signal, delaying the first input signal on a specific time basis using each of first delay blocks, generating first phase-divided signals by performing first phase division on signals of input/output nodes for each of the first delay blocks on a predefined Phase-Interpolation (PI) delay time basis, and outputting the second input signal and a phase-divided signal closest to the second input signal, among the first phase-divided signals, a time amplifier for independently time-amplifying the second input signal and the phase-divided signal closest to the second input signal, and a second TDC unit for delaying a phase-divided signal closest to the time-amplified second input signal on a specific time basis using each of second delay blocks, and generating second phase-divided signals by performing second phase division on signals of input/output nodes for each of the second delay blocks on a predefined PI delay time basis.

16 Claims, 7 Drawing Sheets

(a) PI (600)

(b) RESISTOR TUNING ARRAY (610)

(c) RESISTOR AUTO-TUNING (620)

TIME-TO-DIGITAL CONVERTER AND OPERATION METHOD THEREOF

PRIORITY

This application claims the benefit under 35 U.S.C. §119 (a) of a Korean patent application filed in the Korean Intellectual Property Office on Apr. 23, 2010 and assigned Serial No. 10-2010-0038067, the entire disclosure of which is hereby incorporated by reference.

BACKGROUND OF THE INVENTION

1. Field of the Invention

The present invention relates to a Time-to-Digital Converter (TDC) and an operation method thereof. More particularly, the present invention relates to a TDC having a high resolution at a Radio Frequency (RF) input frequency by using a Phase-Interpolation (PI) technique and a Time Amplifier (TA), and an operation method thereof.

2. Description of the Related Art

A wireless communication transceiver and the like include a phase-locked loop to provide a Local Oscillator (LO) frequency. Conventionally, an analog phase-locked loop is used, which may cause a reduction in process scale. To solve these and other problems, the analog phase-locked loop may be digitally constructed. In this case, however, the analog phase-locked loop may be insensitive to process variations. To overcome the insensitivity of the analog phase-locked loop, a digital phase-locked loop is used. In the digital phase-locked loop, a Time-to-Digital Converter (TDC) is used to detect a phase difference between an output frequency of a digital oscillator and a reference frequency, and the performance of the digital phase looked loop depends on a resolution of the TDC. The TDC receives two input signals, and delays one of the input signals through a delay line step by step. The TDC compares a waveform of the input signal delayed step by step with a waveform of the other input signal in terms of the rising edge, and outputs the comparison results in a digital code. A phase difference between the two input signals may be identified based on the output digital code.

FIG. 1 schematically illustrates a TDC with a single delay line according to the related art.

Referring to FIG. 1, a TDC 100 includes two input signal lines, L inverters 106-1~106-L for signal delay, and (L+1) comparators 108-0~108-L, which are implemented with their associated flip-flops.

The TDC 100 receives two input signals: a Digital Controlled Oscillator (DCO) frequency $F_{DCO}$ 102 and a reference frequency $F_{REF}$ 104. The $F_{DCO}$ 102 is delayed by each of the L inverters 106-1~106-L and then input to each of the (L+1) comparators 108-0~108-L. Each of the (L+1) comparators 108-0~108-L compares a rising edge of the $F_{DCO}$ delayed by each of the inverters 106-1~106-L with a rising edge of the $F_{REF}$ 104, and outputs the comparison results in a digital code. A phase difference between the input signals may be identified based on the output digital code.

A resolution of the TDC 100 is determined by a delay time of the inverters 106-1~106-L. Since a delay time of an inverter is determined by a size of a transistor constituting the inverter, a resolution of the TDC may be limited to a specific value in a specific process.

Therefore, a need exists for a TDC having a high resolution at a Radio Frequency (RF) input frequency by using a Phase-Interpolation (PI) technique and a Time Amplifier (TA), and an operation method thereof.

SUMMARY OF THE INVENTION

Aspects of the present invention are to address at least the above-mentioned problems and/or disadvantages and to provide at least the advantages described below. Accordingly, an aspect of the present invention is to provide a Time-to-Digital Converter (TDC) using a Phase-Interpolation (PI) technique and a Time Amplifier (TA), and an operation method thereof.

Another aspect of the present invention is to provide a TDC using a PI technique that uses a resistor auto-tuning scheme, and a TA that increases its gain with a time difference caused by the use of additional inverters, and an operation method thereof.

Another aspect of the present invention is to provide a TDC having a high resolution at a Radio Frequency (RF) input frequency, and an operation method thereof.

In accordance with an aspect of the present invention, a TDC is provided. The TDC includes a first TDC unit for receiving a first input signal and a second input signal, delaying the first input signal on a specific time basis using each of first delay blocks, generating first phase-divided signals by performing first phase division on signals of input/output nodes for each of the first delay blocks on a predefined PI delay time basis, and outputting the second input signal and a phase-divided signal closest to the second input signal, among the first phase-divided signals, a time amplifier for independently time-amplifying the second input signal and the phase-divided signal closest to the second input signal, and a second TDC unit for delaying a phase-divided signal closest to the time-amplified second input signal on a specific time basis using each of second delay blocks, and generating second phase-divided signals by performing second phase division on signals of input/output nodes for each of the second delay blocks on a predefined PI delay time basis.

In accordance with another aspect of the present invention, a method for operating a TDC is provided. The method includes receiving a first input signal and a second input signal, delaying the first input signal on a specific time basis using each of first delay blocks, generating first phase-divided signals by performing first phase division on signals of input/output nodes for each of the first delay bocks on a predefined PI delay time basis, and outputting the second input signal and a phase-divided signal closest to the second input signal, among the first phase-divided signals, independently time-amplifying the second input signal and the phase-divided signal closest to the second input signal, delaying the phase-divided signal closest to the time-amplified second input signal on a specific time basis using each of the second delay blocks, and generating second phase-divided signals by performing second phase division on signals of input/output nodes for each of the second delay blocks on a predefined PI delay time basis.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, like reference numerals will be understood to refer to like parts, components, and structures.

DETAILED DESCRIPTION OF EXEMPLARY EMBODIMENTS

Figure 1:
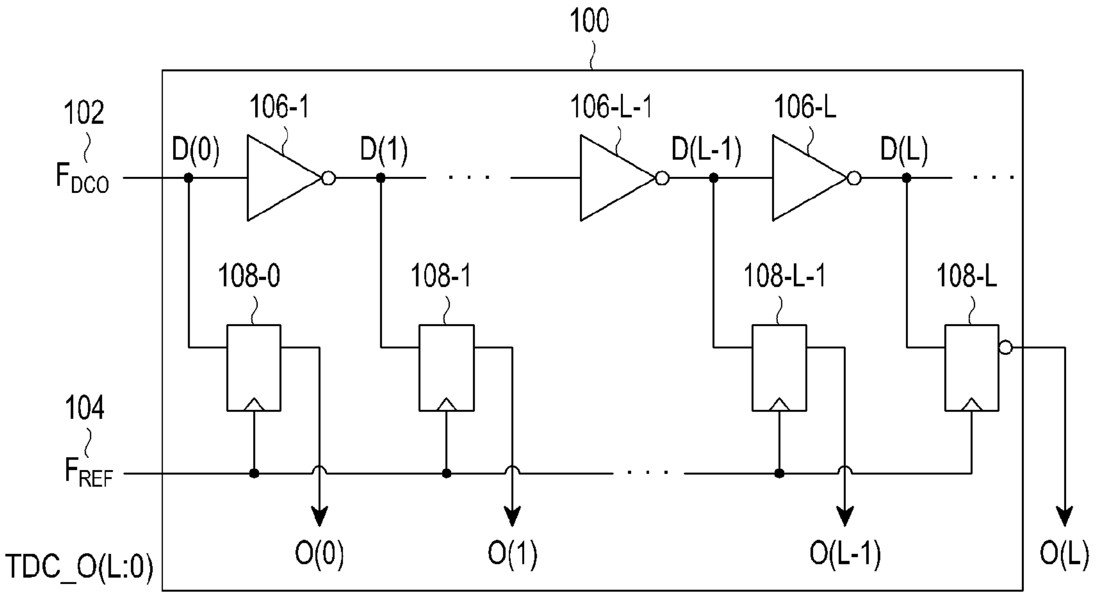
FIG. 1 (RELATED ART)
FIG. 1 is a schematic diagram illustrating a Time-to-Digital Converter (TDC) with a single delay line according to the related art.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to skill in the art, may occur in amounts that do not preclude the effect the characteristic was intended to provide.

Exemplary embodiments of the present invention provide a Time-to-Digital Converter (TDC) having a high resolution at a Radio Frequency (RF) input frequency by using a Phase-Interpolation (PI) technique and a Time Amplifier (TA), and an operation method thereof.

FIGS. 2 through 7, discussed below, and the various exemplary embodiments used to describe the principles of the present disclosure in this patent document are by way of illustration only and should not be construed in any way that would limit the scope of the disclosure. Those skilled in the art will understand that the principles of the present disclosure may be implemented in any suitably arranged communications system. The terms used to describe various embodiments are exemplary. It should be understood that these are provided to merely aid the understanding of the description, and that their use and definitions in no way limit the scope of the invention. Terms first, second, and the like are used to differentiate between objects having the same terminology and are in no way intended to represent a chronological order, unless where explicitly state otherwise. A set is defined as a non-empty set including at least one element.

Figure 2:
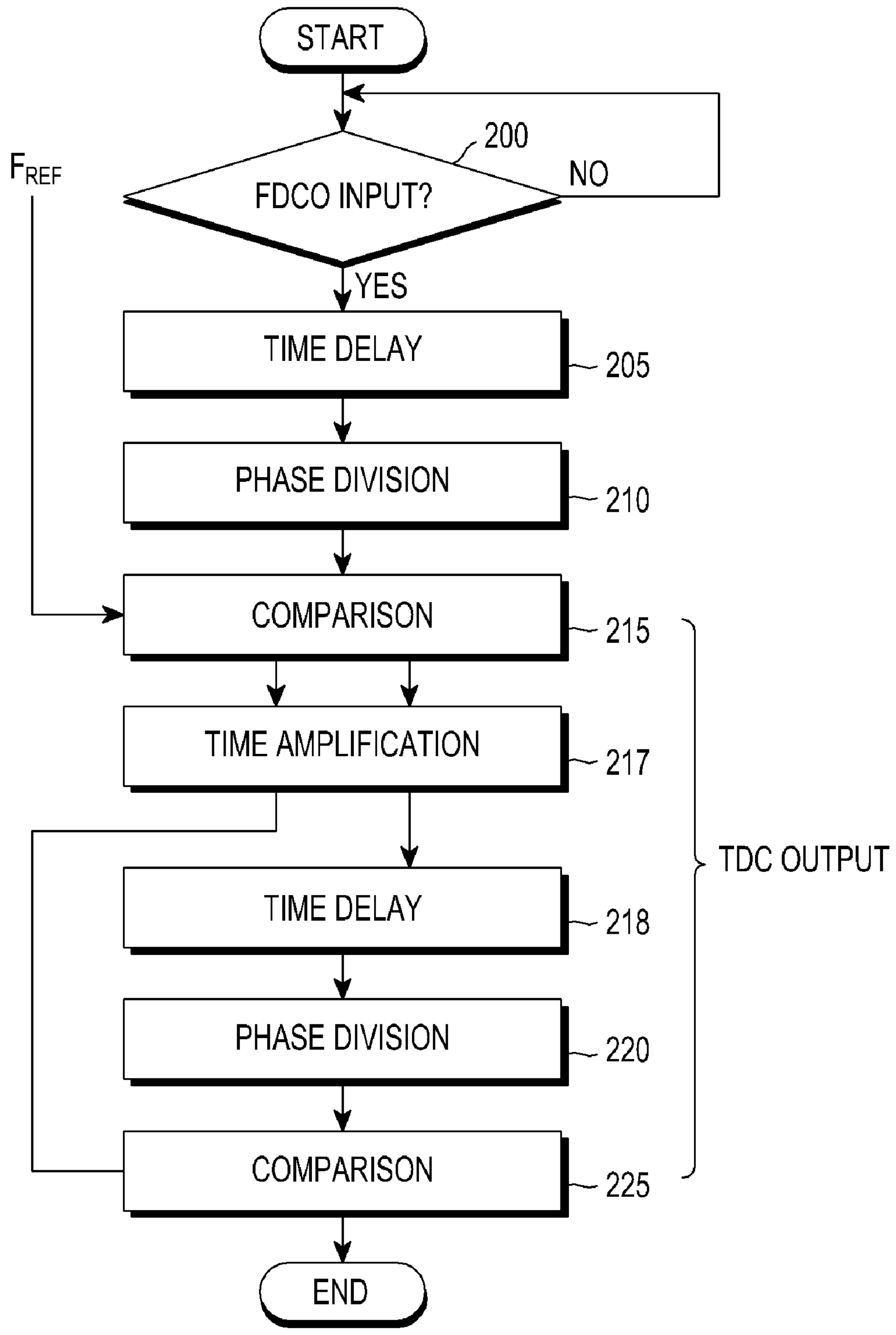
FIG. 2 is a flowchart illustrating a flow of an input signal in a TDC according to an exemplary embodiment of the present invention.

FIG. 2 is a flowchart illustrating a flow of an input signal in a TDC according to an exemplary embodiment of the present invention.

Referring to FIG. 2, a TDC determines in step 200 whether $F_{DCO}$ is input. If it is determined in step 200 that the $F_{DCO}$ is input, the TDC proceeds to step 205. However, if it is determined in step 200 that no $F_{DCO}$ is input, the TDC waits until the $F_{DCO}$ is input. In step 205, the TDC delays the $F_{DCO}$ on a specific time basis step by step using each of its inverters, which are assumed to be identical in delay time.

In step 210, the TDC phase-divides the delayed $F_{DCO}$ in units of a predefined PI delay time, which is less than a delay time of each of the inverters.

In step 215, the TDC compares a rising edge of each $F_{DCO}$ delayed by each of the inverters with a rising edge of the other input signal $F_{REF}$, and outputs the comparison results in a digital code. The $F_{REF}$ is an original signal that is not time-delayed.

In step 217, the TDC time-amplifies each of the $F_{REF}$ and the time-delayed $F_{DCO}$ which is closest to the $F_{REF}$, among the $F_{DCO}$ values time-delayed on a specific time basis by the inverters. In step 218, the TDC time-delays again the time-amplified $F_{DCO}$ 'TA_$F_{DCO}$' on a specific time basis using each of the inverters. The delay time of each of the inverters, used in step 218, is also assumed to be identical.

In step 220, the TDC phase-divides the TA_$F_{DCO}$ in units of a predefined PI delay time, which is less than a delay time of each of the inverters.

In step 225, the TDC compares each TA_$F_{DCO}$ phase-divided by each of the inverters with the time-amplified $F_{REF}$ 'TA_$F_{REF}$' in terms of the rising edge, and outputs the comparison results in a digital code.

As a result, the digital code that underwent two comparisons in steps 215 and 225 is output as the final results.

Figure 3:
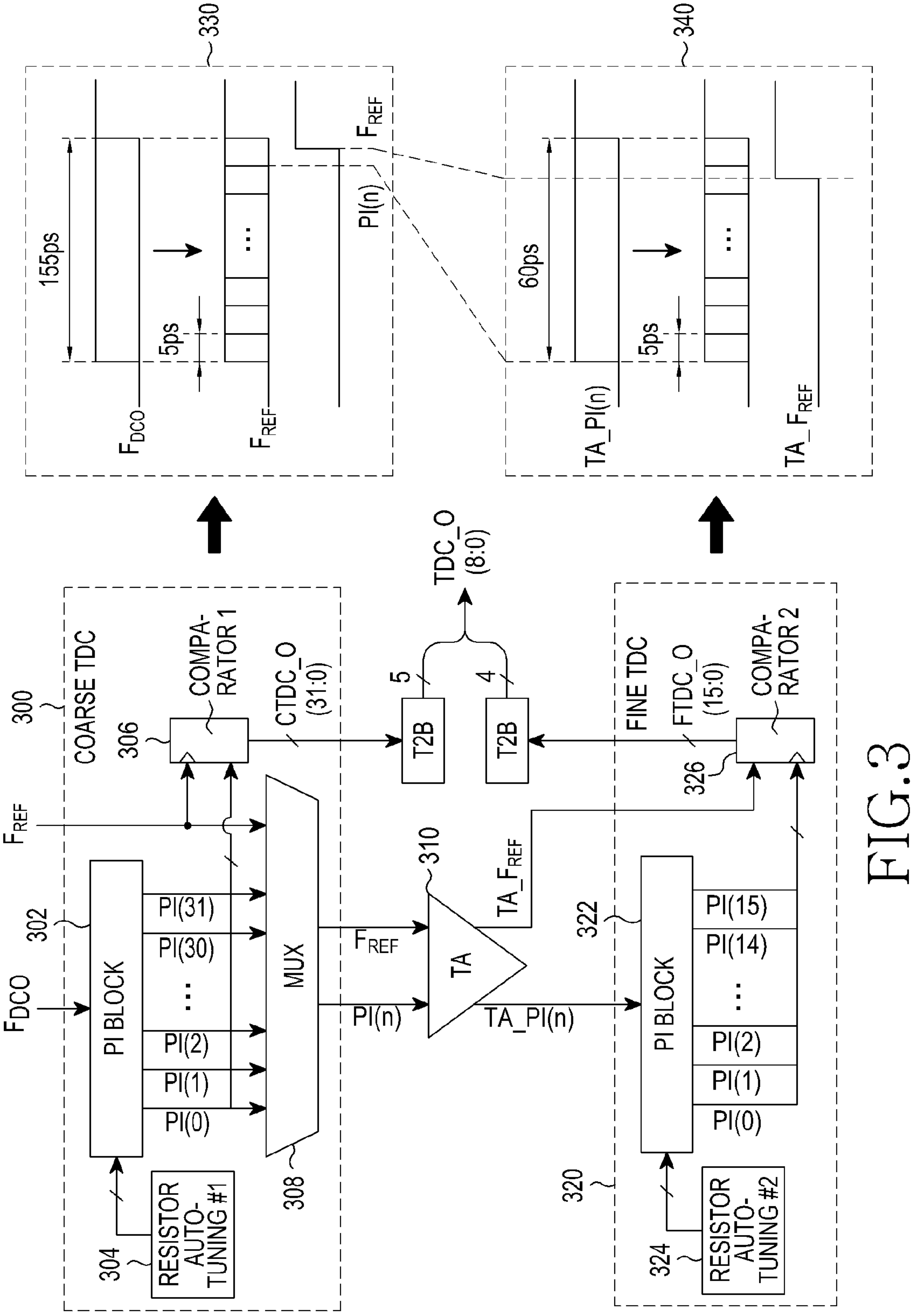
FIG. 3 is a schematic diagram illustrating a structure of a TDC according to an exemplary embodiment of the present invention.

FIG. 3 is a schematic diagram illustrating a structure of a TDC according to an exemplary embodiment of the present invention.

Referring to FIG. 3, a TDC includes a coarse TDC 300, a TA 310, and a fine TDC 320.

The coarse TDC 300 includes a PI block 302, a resistor auto-tuning unit #1 304, a comparator #1 306, and a multiplexer (MUX) 308. The resistor auto-tuning unit #1 304 includes resistors for tuning resistances used in a voltage dividing operation involved in phase division so that the PI block 302 may not operate sensitively to process variations. An operation of the resistor auto-tuning unit #1 304 will be described below.

Two input signals $F_{DCO}$ and $F_{REF}$ are input to the coarse TDC 300. Although not illustrated in the drawing, the $F_{DCO}$ is delayed on a specific time basis by multiple delays each of which is implemented with an inverter as illustrated in FIG. 1, and each of the delays delivers its delayed input signal to the PI block 302. On the other hand, the $F_{REF}$ is delivered to the comparator #1 306 and the MUX 308 without any signal distortion.

The PI block 302 divides the delayed $F_{DCO}$ on a predefined PI delay time basis. For example, it is assumed in a block 330 that if the PI delay time is 5 ps, a delay range of the $F_{DCO}$ is 155 ps. In this case, the delayed $F_{DCO}$ is divided into a total of 32 5-ps PI waves PI(0), . . . , PI(31), and then input to the comparator #1 306 and the MUX 308.

The comparator #1 306 compares each of the PI(0), . . . , PI(31) with the $F_{REF}$ in terms of the rising edge, and outputs a thermometer code CTDC_O (31:0).

The MUX 308 selects a PI(n) which is closest to the rising edge of the $F_{REF}$, from among the 31 PI waveforms, and outputs it to the TA 310 together with the $F_{REF}$.

The TA 310 time-amplifies each of the PI(n) and the $F_{REF}$, and outputs each of the time-amplified PI TA_PI(n) and the time-amplified $F_{REF}$ TA_$F_{REF}$ as an input to the fine TDC 320.

The fine TDC 320 includes a PI block 322, a resistor auto-tuning unit #2 324, and a comparator #2 326. The resistor auto-tuning unit #2 324 includes resistors for tuning resistances used in a voltage dividing operation involved in phase division so that the PI block 322 may not operate sensitively to process variations. An operation of the resistor auto-tuning unit #2 324 will be described below.

Although not illustrated in the drawing, the TA_PI(n) is delayed on a specific time basis by multiple delays each of which is implemented with an inverter as illustrated in FIG. 1, and each of the delays delivers its delayed input signal to the PI block 322. On the other hand, the TA_$F_{REF}$ is delivered to the comparator #2 326 without any signal distortion. The PI block 322 divides the delayed TA_PI(n) on a predefined PI delay time basis. For example, it is assumed in a block 340 that if the PI delay time is 5 ps, a delay range of the TA_PI(n) is 60 ps. In this case, the delayed TA_PI(n) is divided into a total of 16 5-ps PI waves PI(0), . . . , PI(15), and then input to the comparator #2 326.

The comparator #2 326 compares each of the PI(0), . . . , PI(15) with the TA_$F_{REF}$ in terms of the rising edge, and outputs a thermometer code FTDC_O(15:0).

The CTDC_O(31:0) and FTDC_O(15:0), which are output from the coarse TDC 300 and the fine TDC 320, respectively, are converted into a 5-bit binary code and a 4-bit binary code by their associated Thermometer-to-Binary (T2B) blocks or binary code converters, respectively, and then output as a TDC_O(8:0).

Figure 4:
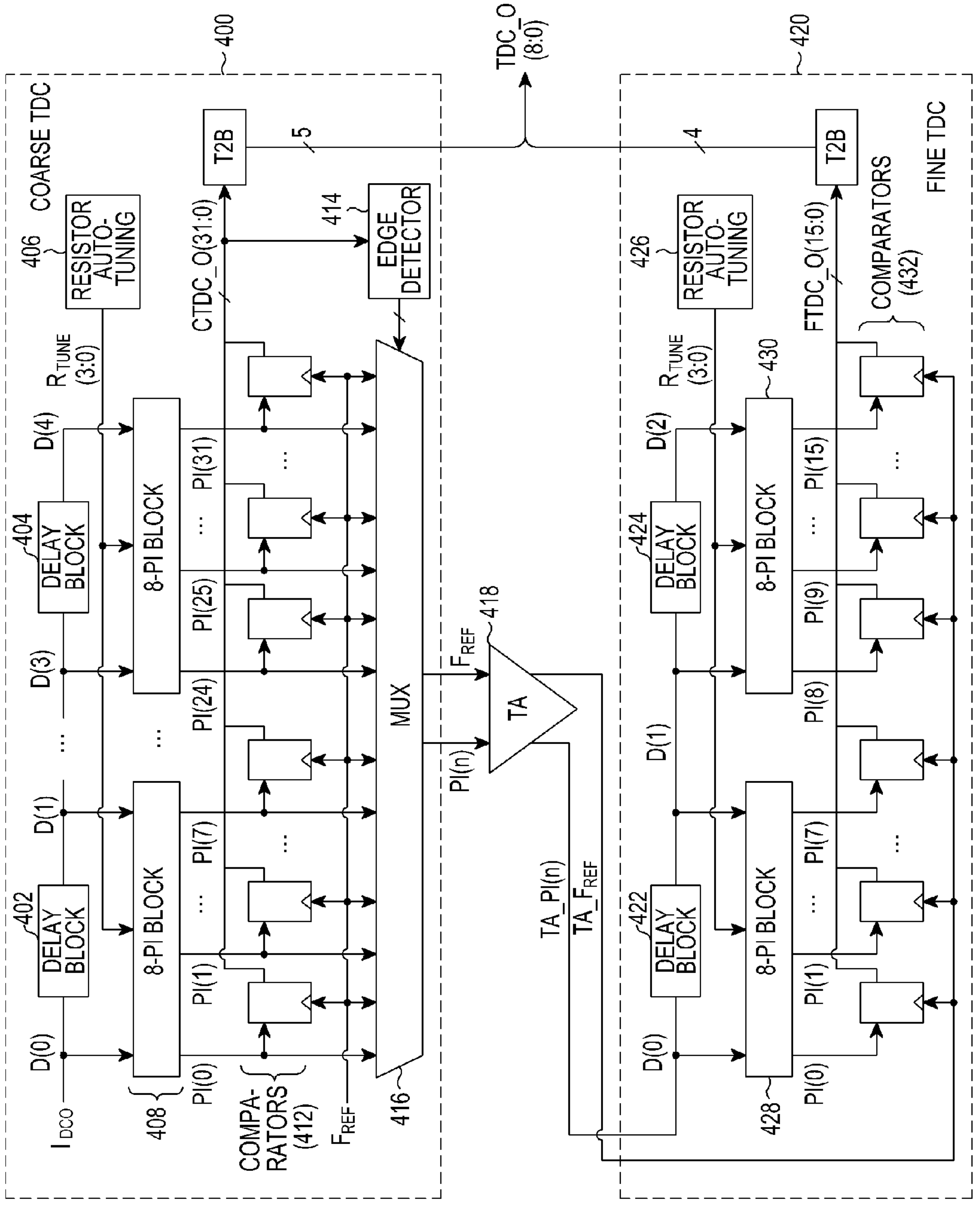
FIG. 4 is a block diagram illustrating an overall structure of a TDC according to an exemplary embodiment of the present invention.

FIG. 4 is a block diagram illustrating an overall structure of a TDC according to an exemplary embodiment of the present invention.

Referring to FIG. 4, a TDC includes a coarse TDC 400, a TA 418, and a fine TDC 420.

The coarse TDC 400 includes delay blocks 402 and 404 each including 2 inverters, a resistor auto-tuning unit 406, a total of 4 8-PI blocks 408 each outputting 8 PIs, comparators 412 each including a flip-flop, an edge detector 414, and a MUX 416.

The coarse TDC 400 receives $F_{DCO}$ and $F_{REF}$ as its input signals. The $F_{REF}$ is a reference frequency provided from a crystal Oscillator (OSC). The $F_{DCO}$ is output after being delayed by the delay blocks 402 and 404. Output signals generated by delaying the $F_{DCO}$ on a specific time basis are D(0), D(1), . . . , D(4), and for example, a delay time in each of the D(0), D(1), . . . , D(4), i.e., a delay time in each of the delay blocks 402 and 404 is assumed to be 40 ps. Signals output from the D(0), D(1), . . . , D(4) are input to each of the 8-PI blocks 408 two by two. More particularly, each of the 8-PI blocks 408 phase-divides two input signals, for example, D(0) and D(1) into a total of 8 signals PI(0) to PI(7). A delay time of each PI is assumed to be 5 ps, which is less than the delay time of each of the delay blocks 402 and 404. The coarse TDC 400 outputs PI(0) to PI(31) by phase-dividing the delayed $F_{DCO}$ on a 5 ps basis using the total of 4 8-PI blocks 408. Although not illustrated in FIG. 4, each of the total of 4 8-PI blocks 408 needs a voltage dividing procedure to output phase-divided PI(n), and resistors are used in the voltage dividing procedure. However, the resistors have error values by process variations. Therefore, each of the total of 4 8-PI blocks 408 receives $R_{TUNE}$(3:0) output from the resistor auto-tuning unit 406 and automatically recovers errors caused by process variations for the voltage used in voltage division, to their original values.

Thereafter, each of the comparators 412 compares a rising edge of each of PI(0) to PI(31) output from each of the total of 4 8-PI blocks 408 with a rising edge of the $F_{REF}$, and outputs the comparison results in a thermometer code CTDC_O(31:0). The edge detector 414 detects a PI(n) closest to the rising edge of the $F_{REF}$, and outputs it to the MUX 416. For example, two signals having been input to a comparator having output '10' from CTDC_O(31:0) are assumed to be a PI(n) closest to the rising edge of the $F_{REF}$.

The TA 418 amplifies a time difference between the PI(n) output from the coarse TDC 400 and the $F_{REF}$ in the time domain, and outputs the time-amplified TA_PI(n) and TA_$F_{REF}$.

The fine TDC 420 includes delay blocks 422 and 424 each including 2 inverters, a resistor auto-tuning unit 426, a total of 2 8-PI blocks 428 and 430 each outputting 8 PIs, and comparators 432 each including a flip-flop.

The TA_PI(n) is time-delayed by each of the delay blocks 422 and 424. The output signals generated by delaying the TA_PI(n) are D(0), D(1), . . . , D(4), and for example, a delay time in each of the D(0), D(1), . . . , D(4), i.e., a delay time of each of the delay blocks 422 and 424 is assumed to be 40 ps. Signals output from the D(0), D(1), . . . , D(4) are input to each of the 8-PI blocks 428 and 430 two by two. More particularly, the 8-PI block 428 phase-divides two input signals, for example, D(0) and D(1) into a total of 8 signals PI(0) to PI(7). A delay time of each PI is assumed to be 5 ps, which is less than the delay time of each of the delay blocks 422 and 424. Similarly, the 8-PI block 430 phase-divides two input signals, for example, D(3) and D(4) into a total of 8 signals PI(8) to PI(15). As a result, the fine TDC 420 outputs a total of 16 phase-shifted signals PI(0) to PI(15) using the total of 2 8-PI blocks 428 and 430. Each of the 8-PI blocks 428 and 430 receives $R_{TUNE}$(3:0) output from the resistor auto-tuning unit 426 and automatically recovers resistances changed by process variations to their original values. Specific operations of the resistor auto-tuning units 406 and 426 will be described below with reference to FIG. 7.

Thereafter, each of the comparators 432 compares a rising edge of each of the PI(0) to the PI(15) output from each of the 8-PI blocks 428 and 430 with a rising edge of the TA_$F_{REF}$, and outputs the comparison results in a thermometer code FTDC_O (15:0).

The CTDC_O(31:0) and FTDC_O(15:0) output from the coarse TDC 400 and the fine TDC 420, respectively, are converted into a 5-bit binary code and a 4-bit binary code by their associated T2B blocks, respectively, and finally output as a TDC_O(8:0).

Figure 5:
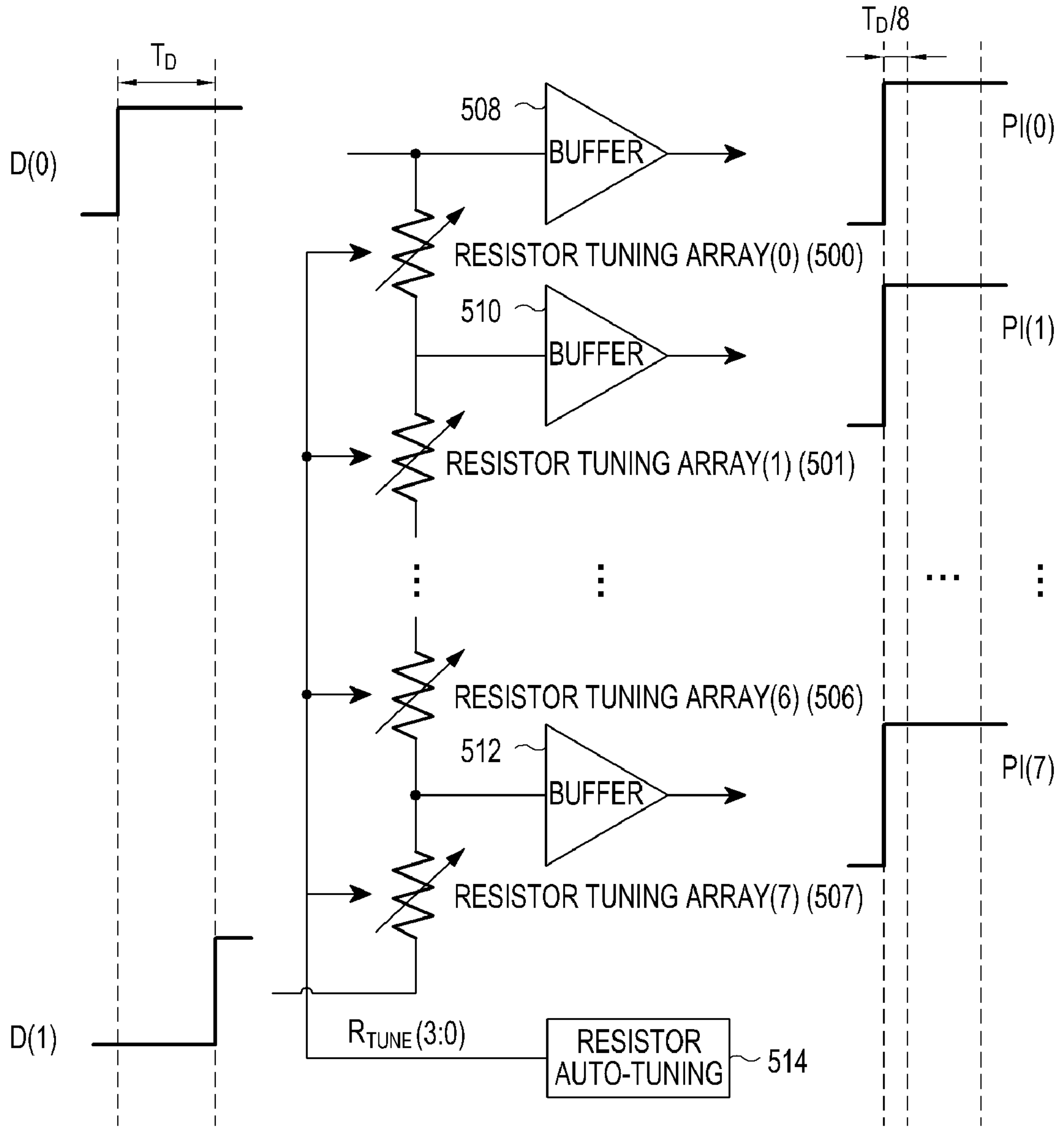
FIG. 5 is a block diagram illustrating a structure of a Phase-Interpolation (PI) block to which resistor auto-tuning is applied according to an exemplary embodiment of the present invention.
Figure 6:
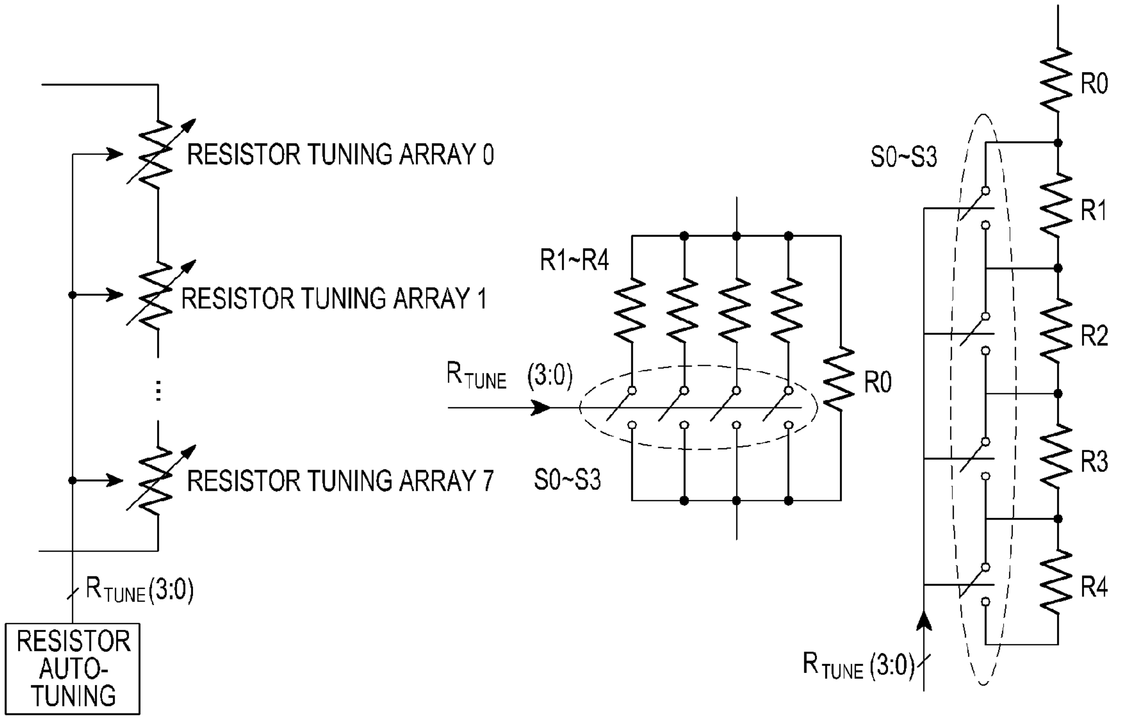
FIGS. 6A through 6C are block diagrams illustrating a structure of a PI block according to an exemplary embodiment of the present invention.
Figure 6:
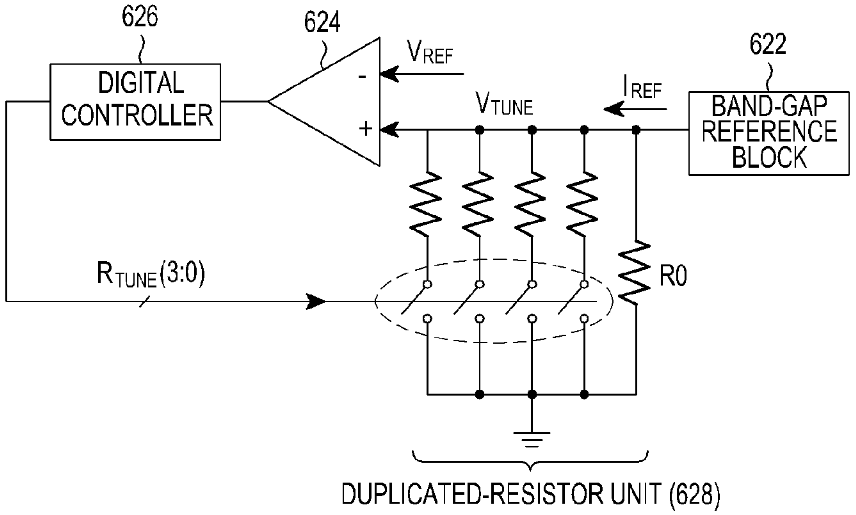

FIG. 5 is a block diagram illustrating a structure of a PI block to which resistor auto-tuning is applied according to an exemplary embodiment of the present invention.

Referring to FIG. 5, a PI block includes 8 resistor tuning arrays #0 through #7 (500 through 507), and their associated buffers 508 through 512.

The PI block receives 2 delay signals, for example, D(0) and D(1) generated by delaying an input $F_{DCO}$ on a specific time basis in the previous step by a delay block including two inverters, and voltage-divides a voltage difference between the D(0) and the D(1) by resistors. A time difference between the D(0) and the D(1) is $T_D$. The D(0) and the D(1) undergo voltage division by the 8 resistor tuning arrays #0 through #7 (500 through 507), and then are delivered to the buffers 508 through 512. The buffers 508 through 512 output 8 signals PI(0) to PI(7), respectively, by phase-dividing a time interval between the voltage-divided D(0) and D(1) on a predefined PI delay time basis. A time difference among the PI(0) to the PI(7) is $T_D/8$.

In order for a PI block to output input signals in divided signals to have the identical phases, no error should exist in resistances of resistors used in voltage division. However, resistors used for voltage division may have errors of approximately ±15% due to process variations. In order to reduce or eliminate the errors of resistors, an exemplary embodiment of the present invention employs a resistor auto-tuning scheme in which even though resistances of resistors used for voltage division for PI are changed due to process variations, the resistances of resistors may be automatically recovered to their original resistances. That is, a resistor auto-tuning unit 514 automatically tunes errors of the resistor tuning arrays #0 through #7 using control bits of a tuning resistance $R_{TUNE}$(3:0).

FIGS. 6A through 6C are block diagrams illustrating a structure of a PI block according to an exemplary embodiment of the present invention.

Referring to FIGS. 6A through 6C, a block 600 includes a resistor auto-tuning unit and resistor tuning arrays #0 through #7 connected to thereto. Each of the resistor tuning arrays #0 through #7 may tune its resistance according to the control bits of $R_{TUNE}$(3:0) output from the resistor auto-tuning unit.

A block 610 represents a structure of each of the resistor tuning arrays #0 through #7. R0 represents a main resistor used for voltage division in a PI operation of a TDC, and R1, R2, R3 and R4 represent sub resistors capable of tuning an error of ±15%, which may occur in the R0. By turning on/off switches S0, S1, S2 and S3 connected in parallel to the sub resistors R1, R2, R3 and R4 depending on the $R_{TUNE}$(3:0), the ±15% error of the R0 may be tuned. As illustrated in the block 610, each of the resistor tuning arrays #0 through #7 may include the main resistor R0 and the sub resistors R1, R2, R3 and R4, which are connected in parallel, or in series.

A block 620 represents a structure of the resistor auto-tuning unit. The resistor auto-tuning unit includes a band-gap reference block 622, a comparator 624, a digital controller 626, and a duplicated-resistor unit 628.

As the band-gap reference block 622 generates a reference current $I_{REF}$ having a specific level and applies it to duplicated resistors created in the same connection form as that of the sub resistors connected to the main resistor in the block 610, a specific voltage $V_{TUNE}$ is formed on the duplicated resistors. The comparator 624 compares the formed $V_{TUNE}$ and a reference voltage $V_{REF}$ to calculate a difference there between, and generates a compensation resistance $R_{TUNE}$(3:0) by means of the digital controller 626. The $R_{TUNE}$(3:0) is connected to switches in the duplicated-resistor unit 628, and applies control bits for turning on/off the switches, thereby compensating for an error of the R0. For example, if a resistance of the main resistor R0 in the resistor tuning array 610 becomes lower than its original value due to process variations, a resistance of the R0 in the duplicated-resistor unit 628 also becomes lower than its original value because the duplicated-resistor unit 628 has the same connection structure as that of the resistor tuning array 610, for example, because the R0 and the sub resistors are connected in parallel. In this case, because the $I_{REF}$ is constant, the $V_{TUNE}$ is also reduced. The digital controller 626 compares the lowered $V_{TUNE}$ with the $V_{REF}$, and increases resistances of the duplicated resistors by increasing the $R_{TUNE}$(3:0) because the resistance of the R0 became lower than its original value. As described above, the resistor auto-tuning unit 620 generates $R_{TUNE}$(3:0) that serves as a negative feedback and compensates the main resistor R0. As the $R_{TUNE}$(3:0) is applied to the resistor tuning array 610, output waveforms for PI are finally output at regular phase intervals regardless of the process variations.

Figure 7:
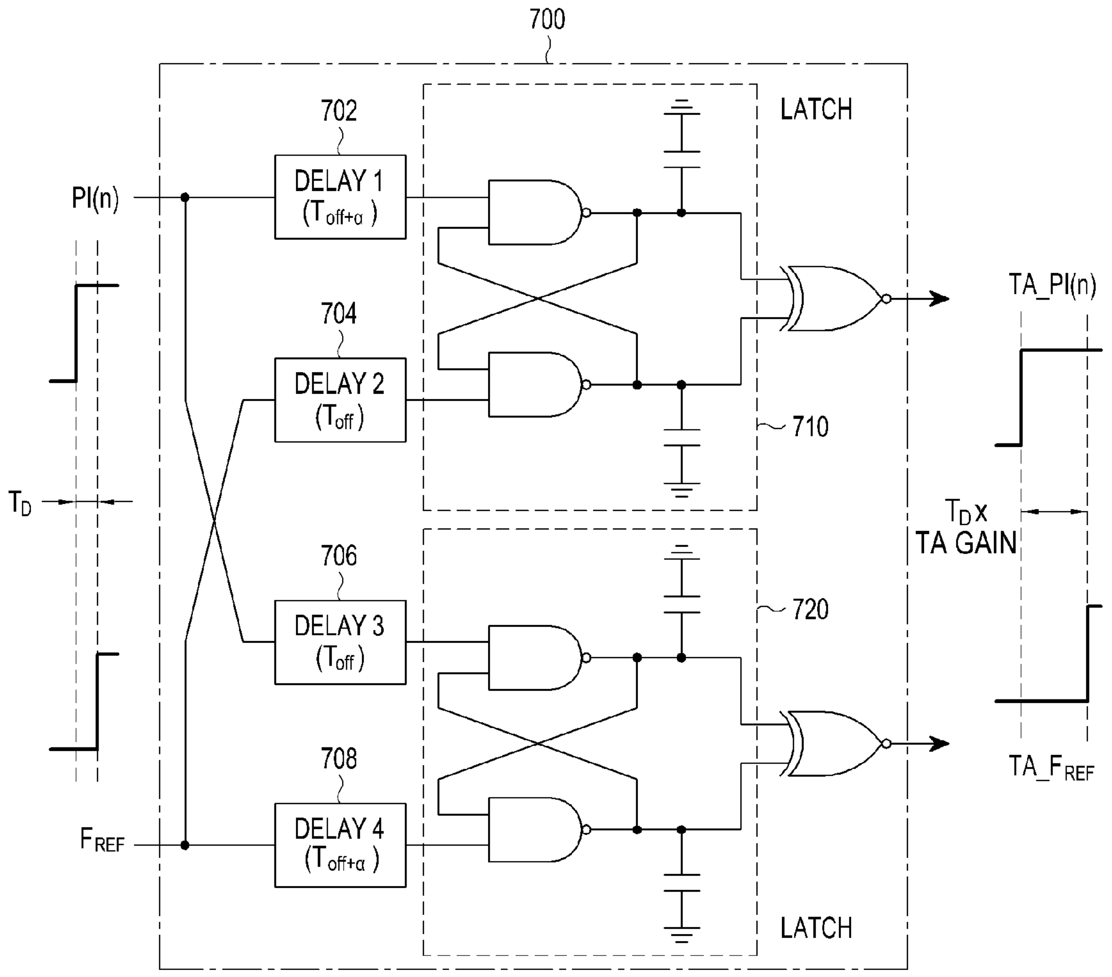
FIG. 7 is a block diagram illustrating a structure of a Time Amplifier (TA) according to an exemplary embodiment of the present invention.

FIG. 7 is a block diagram illustrating a structure of a TA according to an exemplary embodiment of the present invention.

Referring to FIG. 7, a TA 700 receives, as input signals, $F_{REF}$ and PI(n) which is selected by a MUX in a coarse TDC, amplifies a time interval $T_D$ between the PI(n) and the $F_{REF}$ widely in the time domain, and multiplies the time interval $T_D$ by a gain TA of the TA 700 ($T_D$×TA).

The TA 700 includes two latches 710 and 720, and delay units #1 through #4 (702 through 708) having different delay times. The delay unit #1 (702) and the delay unit #4 (708) have a delay time $T_{off+\alpha}$, and the delay unit #2 (704) and the delay unit #3 (706) have a delay time $T_{off}$. As (α) may be realized by a delay time caused by an inverter, i.e., a value much smaller than $T_{off}$, a gain of the TA 700 may be increased. This will be described below.

A gain of the TA 700 is represented as shown in Equation (1) below. That is, the gain of the TA 700 is inversely proportional to a transconductance ($g_m$) of NAND gates and a time difference (α) between two inputs to the latches 710 and 720, and is proportional to output Capacitances (C) of the latches 710 and 720.

$$TASmall-SignalGain = \frac{2C}{g_m \times \alpha} \tag{1}$$

C is increased to increase a gain of the TA, but the increase in C restricts an operation of the TA at a high frequency. Therefore, in the TA proposed by exemplary embodiments of the present invention, a capacitance of the C is reduced as much as possible and the time difference α between two inputs to the latches 710 and 720 is set to its minimum value to increase the gain of the TA. To create a time difference between two input signals to the latches 710 and 720, one of the two input signals is additionally delayed. For the delay, a delay time of an inverter is commonly used. In this case, because the minimum value of a delay time of the inverter is limited due to process difficulties, different delay times $T_{off}$ and $T_{off+\alpha}$ are applied to input signals to the latches 710 and 720 and a difference therebetween is used. As the α may be realized by a delay time of the inverter, i.e., a value much smaller than $T_{off}$, a gain of the TA 700 may be increased. In addition, because input signals to the latches 710 and 720 are delayed by delay units having different delay times, and a difference between the delay times is used, even though delay times of the delay units are changed due to process variations, a difference between the delay times is always constant, ensuring insensitivity to the process variations.

As is apparent from the foregoing description, exemplary embodiments of the present invention provide a TDC using a PI technique that uses a resistor auto-tuning scheme, and a TA that increases its gain with a time difference caused by the use of additional inverters. Thus, the TDC may have a high resolution at an RF input frequency.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A Time-to-Digital Converter (TDC) comprising:

a first TDC unit for receiving a first input signal and a second input signal, delaying the first input signal on a specific time basis using each of first delay blocks, generating first phase-divided signals by performing first phase division on signals of input/output nodes for each of the first delay blocks on a predefined Phase-Interpolation (PI) delay time basis, and outputting the second input signal and a phase-divided signal closest to the second input signal, among the first phase-divided signals;

a time amplifier for independently time-amplifying the second input signal and the phase-divided signal closest to the second input signal; and a second TDC unit for delaying a phase-divided signal closest to the time-amplified second input signal on a specific time basis using each of second delay blocks, and generating second phase-divided signals by performing second phase division on signals of input/output nodes for each of the second delay blocks on a predefined PI delay time basis.

2. The TDC of claim 1, wherein the first TDC unit comprises:

a first comparison unit for comparing a rising edge of each of waveforms corresponding to the first phase-divided signals with a rising edge of a waveform corresponding to the second input signal, and converting the comparison results into a thermometer code; and a converter for converting the thermometer code output from the first comparison unit into a binary code.

3. The TDC of claim 1, wherein the second TDC unit comprises:

a second comparison unit for comparing a rising edge of each of waveforms corresponding to the second phase-divided signals with a rising edge of a waveform corresponding to the time-amplified second input signal, and converting the comparison results into a thermometer code; and a converter for converting the thermometer code output from the second comparison unit into a binary code.

4. The TDC of claim 1, wherein the first TDC unit comprises:

resistor tuning arrays for voltage-dividing a voltage difference between signals of input/output nodes for each of the first delay blocks; and a resistor compensation unit for compensating for errors of resistors constituting each of the resistor tuning arrays.

5. The TDC of claim 4, wherein each of the resistor tuning arrays comprises:

a main resistor used for the voltage division; and sub resistors connected in parallel or series to the main resistor to compensate for an error occurring in the main resistor, wherein the sub resistors are turned on/off according to a control signal received from the resistor compensation unit.

6. The TDC of claim 5, wherein the resistor compensation unit comprises:

a band-gap reference block for generating a reference current;

a duplicated-resistor unit including resistors duplicated in the same connection form as that of the main resistor and the sub resistors;

a comparator for comparing a voltage generated by applying the reference current to the duplicated-resistor unit, with the reference voltage; and a digital controller for outputting the control signal for controlling turning on/off of the duplicated resistors according to the comparison results.

7. The TDC of claim 6, wherein the time amplifier comprises:

third and fourth delay blocks for respectively delaying input signals in units of different delay times; and a latch for receiving and latching two signals output from the third and fourth delay blocks.

8. The TDC of claim 7, wherein a gain of the time amplifier is inversely proportional to a difference between delay times of the third and fourth delay blocks, wherein the difference between delay times of the third and fourth delay blocks is set to a minimum value.

9. The TDC of claim 5, wherein the error occurring in the main resistor is compensated for by applying control bits for turning on/off switches connected in parallel to the sub resistors.

10. A method for operating a Time-to-Digital Converter (TDC), the method comprising:

receiving a first input signal and a second input signal;

delaying the first input signal on a specific time basis using each of first delay blocks;

generating first phase-divided signals by performing first phase division on signals of input/output nodes for each of the first delay bocks on a predefined Phase-Interpolation (PI) delay time basis, and outputting the second input signal and a phase-divided signal closest to the second input signal, among the first phase-divided signals;

independently time-amplifying the second input signal and the phase-divided signal closest to the second input signal;

delaying the phase-divided signal closest to the time-amplified second input signal on a specific time basis using each of the second delay blocks; and generating second phase-divided signals by performing second phase division on signals of input/output nodes for each of the second delay blocks on a predefined PI delay time basis.

11. The method of claim 10, further comprising:

comparing a rising edge of each of waveforms corresponding to the first phase-divided signals with a rising edge of a waveform corresponding to the second input signal, and converting the comparison results into a thermometer code; and converting the thermometer code into a binary code.

12. The method of claim 10, further comprising:

comparing a rising edge of each of waveforms corresponding to the second phase-divided signals with a rising edge of a waveform corresponding to the time-amplified second input signal, and converting the comparison results into a thermometer code; and converting the thermometer code into a binary code.

13. The method of claim 10, further comprising:

voltage-dividing a voltage difference between signals of input/output nodes for each of the first delay blocks, wherein sub resistors are connected in parallel or series to a main resistor used for the voltage division, and turned on/off according to a control signal to tune an error occurring in the main resistor.

14. The method of claim 13, wherein the control signal is generated by comparing a reference voltage with a voltage generated by applying a reference current to a duplicated-resistor unit including resistors duplicated in the same connection form as that of the main resistor and the sub resistors, and wherein the control signal is used to control turning on/off of the duplicated resistors.

15. The method of claim 14, wherein the time-amplifying is performed by a time amplifier whose gain is inversely proportional to a difference between delay times of third and fourth delay blocks for delaying input signals in units of different delay times, wherein the difference between delay times of the third and fourth delay blocks is set to a minimum value.

16. The TDC of claim 13, wherein the error occurring in the main resistor is compensated for by applying control bits for turning on/off switches connected in parallel to the sub resistors.

* * * * *